United States Patent
Prodić et al.

(10) Patent No.: US 7,710,174 B2
(45) Date of Patent: May 4, 2010

(54) DIGITAL PULSE-WIDTH MODULATOR BASED ON NON-SYMMETRIC SELF-OSCILLATING CIRCUIT

(75) Inventors: Aleksandar Prodić, Toronto (CA); Kun Wang, Berkeley (CA); Amir Parayandeh, North York (CA)

(73) Assignee: Exar Corporation, Fremont, CA (US)

( * ) Notice: Subject to any disclaimer, the term of this patent is extended or adjusted under 35 U.S.C. 154(b) by 269 days.

(21) Appl. No.: 12/034,593

(22) Filed: Feb. 20, 2008

(65) Prior Publication Data

US 2008/0224756 A1 Sep. 18, 2008

Related U.S. Application Data

(60) Provisional application No. 60/895,373, filed on Mar. 16, 2007.

(51) Int. Cl.
*H03K 7/08* (2006.01)
(52) U.S. Cl. ............... 327/172; 332/109; 363/41; 375/238
(58) Field of Classification Search ............... 327/172; 332/109; 363/41; 375/238
See application file for complete search history.

(56) References Cited

U.S. PATENT DOCUMENTS

| | | | |
|---|---|---|---|
| 6,181,123 B1* | 1/2001 | Jou et al. ............... | 323/351 |
| 6,262,616 B1* | 7/2001 | Srinivasan et al. ............... | 327/264 |
| 6,546,048 B1* | 4/2003 | Ichiba et al. ............... | 375/238 |
| 2005/0280458 A1* | 12/2005 | Leung et al. ............... | 327/172 |
| 2006/0055574 A1* | 3/2006 | Maksimovic et al. ............... | 341/155 |
| 2006/0214712 A1 | 9/2006 | O'Malley et al. | |
| 2006/0227861 A1 | 10/2006 | Maksimovic et al. | |
| 2006/0276915 A1 | 12/2006 | Kelly | |
| 2006/0279969 A1 | 12/2006 | Leung et al. | |
| 2007/0195876 A1* | 8/2007 | Prodic ............... | 375/238 |
| 2009/0066382 A1* | 3/2009 | Yousefzadeh et al. ............... | 327/175 |

OTHER PUBLICATIONS

International Search Report for PCT/US08/57077, dated Aug. 4, 2008, 7 pages.

* cited by examiner

*Primary Examiner*—Lincoln Donovan
*Assistant Examiner*—Ryan C Jager
(74) *Attorney, Agent, or Firm*—Fliesler Meyer LLP (57) ABSTRACT

A low-power digital pulse-width modulator (DPWM) architecture for high frequency dc-dc switch-mode power supplies (SMPS) is disclosed that is well-suited for integration in power management systems of small handheld devices. The DPWM can operate in a stand-alone mode, without external clock, and can be implemented on a portion of silicon area needed for other DPWM solutions. In addition it has low power consumption and provides a good linearity of the input-to-output characteristic, also not characteristic for other architectures.

15 Claims, 7 Drawing Sheets

DIGITAL PULSE-WIDTH MODULATOR BASED ON NON-SYMMETRIC SELF-OSCILLATING CIRCUIT

CLAIMS OF PRIORITY

This application claims priority to U.S. Provisional Application No. 60/895,373, entitled "DIGITAL PULSE-WIDTH MODULATOR BASED ON NON-SYMMETRIC SELF OSCILLATING CIRCUIT" by Prodić et al., filed on Mar. 16, 2007.

BACKGROUND OF INVENTION

In existing miniature handheld devices such as cell phones, PDAs, and MP3 players dedicated analog ICs are almost exclusively used to control switch mode power supplies (SMPS). The ICs consume very low power and, usually, operate as constant frequency pulse-width modulator (PWM) controllers that are, because of less wide-bandwidth noise, preferred to variable-frequency solutions. The analog controllers require relatively long design process and need to be almost completely redesigned each time implementation technology changes. As such, they are not suitable for monolithic integration with fast changing digital hardware, on which the majority of portable devices are based. Moreover, in the latest CMOS processes not all functional blocks of analog controllers can be implemented due to very limited supply voltages.

Digital control of low-power SMPS allows easier system integration and, supported by automated design tools, fast transition of designs from one implementation technology to another. Furthermore, the digital control can simplify realization of advanced power management techniques.

Although the potentials of digital controllers are known, in low-power SMPS they are sporadically used. Implemented in the same IC design technology, the digital controllers take significantly larger silicon area, have higher power consumption, and, often operate at lower switching frequency that result in poor efficiency and a larger power stage that negate all digital advantages.

DETAILED DESCRIPTION

Figure 1:
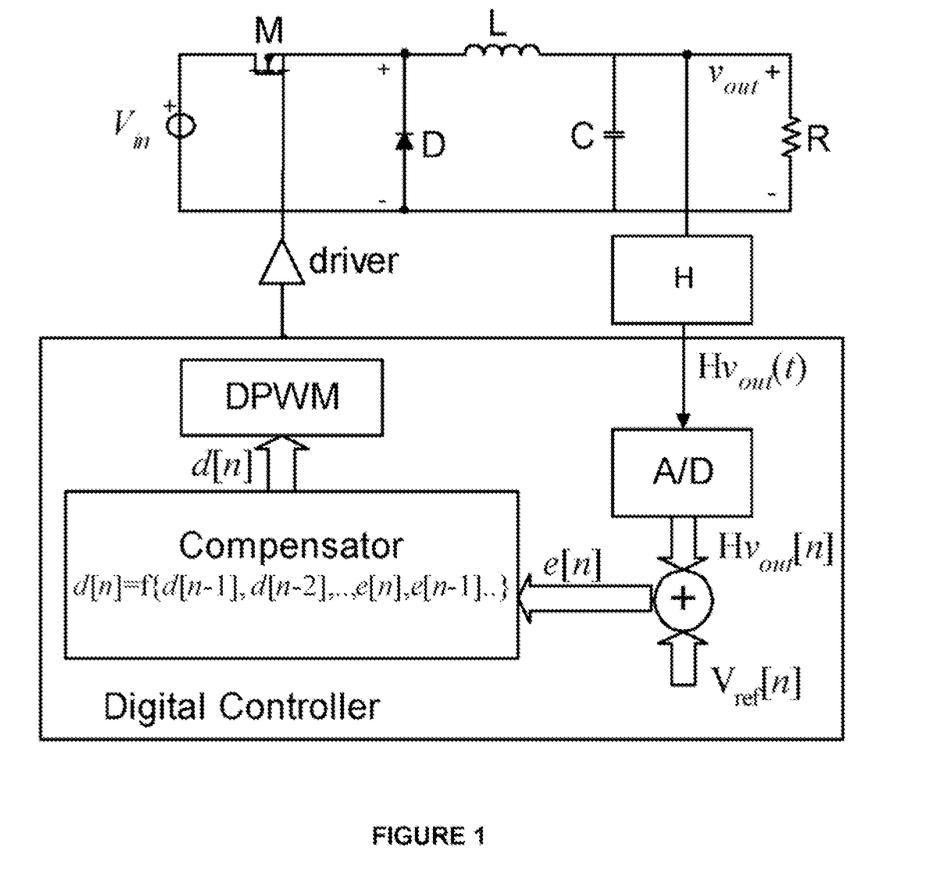
FIG. 1 is a diagram of a digitally controlled switching converter using a DPWM.

One problem in the implementation of high-frequency digitally controlled pulse-width modulated controllers, as the one shown in FIG. 1 is the need for a power efficient, high-frequency digital pulse-width modulator.

The system can regulate the output voltage and operates as follows: The output voltage of a power stage, which can be any switching power converter, is sampled and compared to a desired reference $V_{ref}[n]$. As a result, a digital error signal e[n], proportional to the difference between the output and the desired value is formed, if the output voltage is higher than the reference the error is negative and the lower output results in positive error. Then, e[n] is processed by a digital compensator, which creates a control signal d[n] for the Digital Pulse Width Modulator (DPWM). In most of the cases, the positive error results in an increase of the control variable, large duty ratio value, and consequently, in an increase of the output voltage. The practical implementation of a DPWM is a very challenging task because of the following four conflicting requirements:

- To minimize the size and weight of the SMPS it is required to operate at high switching frequencies, from several hundreds of kHz to several MHz;
- A high-resolution, usually ranging between 8 and 12 bits is needed to eliminate undesirable quantization effects. In particular, undesirable limit-cycle oscillations around the reference value;
- To keep the high overall efficiency of the system, the power consumption of the DPWM needs to be small, negligible compared to the supplied load power;
- To allow economically viable realization, the overall silicon area occupied by the DPWM needs to be small, allowing the implementation of the controller on the area similar to that of analog solutions.

In addition, in cost-sensitive low-power portable applications it also required that the DPWM operates without an external clock signal, which is often created by a crystal oscillator. The counter-based DPWM architecture, conventionally used in motor drive applications, is not suitable for operation at high switching frequencies. They require an external clock at the frequency $2^N f_{sw}$, where N is the resolution of the DPWM, i.e. the number of bits of its input word, and $f_{sw}$, the switching frequency. For example, to achieve 10 bit resolution at switching frequency of 1 MHz, a clock signal at 1.024 GHz would be required. Design of such a structure would be very challenging and it would take a significant amount of power, probably exceeding the power taken by the supplied low. As a result the overall efficiency of the controller would be very low.

A more power efficient DPWM can be obtained using a ring oscillator based architecture, consisting of a $2^N+1$ delay cells connected in a ring and $2^N:1$ multiplexer. The main problem with that architecture is that, to achieve high resolution, it requires a large number of cells and a huge multiplexer taking overly large silicon area.

A segmented delay line based architecture can consist of several smaller multiplexers and delay lines, whose delay cells have logarithmically scaled propagation times. This architecture allows implementation on a small silicon area, and takes very small amount of power but still suffers from three drawbacks. First, it requires an external clock to operate. The second problem is that in some cases, when the matching of the delay cells is not perfect they can result in non-monotonic input-to-output characteristic, and result in undesirable positive feedback, negatively affecting system stability. To eliminate this problem a delay-locked loop (DLL) can be applied. However, the DLL cannot completely eliminate non-linearities caused by an additional delays introduced by the multiplexers.

Embodiments of the system of the present invention can be a new DPWM architecture based on non-symmetric self-oscillating circuit. Embodiments of the new DPWM architecture do not have the previously mentioned problems and can satisfy all of the abovementioned requirements. Namely, 1. The DPWM can operate at high switching frequencies, ranging from several hundreds of kHz, to 10-s of MHz.
2. The DPWM has high resolution. In the included example an 8-bit realization is demonstrated not limiting the use of same design principle to achieve higher resolution.
3. The DPWM takes very small amount of power. As an example, a design consuming 4 μA/MHz, from a 1.8 V supply is demonstrated.
4. The DPWM takes a small silicon area. For an 8-bit implementation about 1/16 of the area needed for the ring oscillator-based architecture.
5. The DPWM can operate as a stand-alone device not needing external clock.

Figure 2:
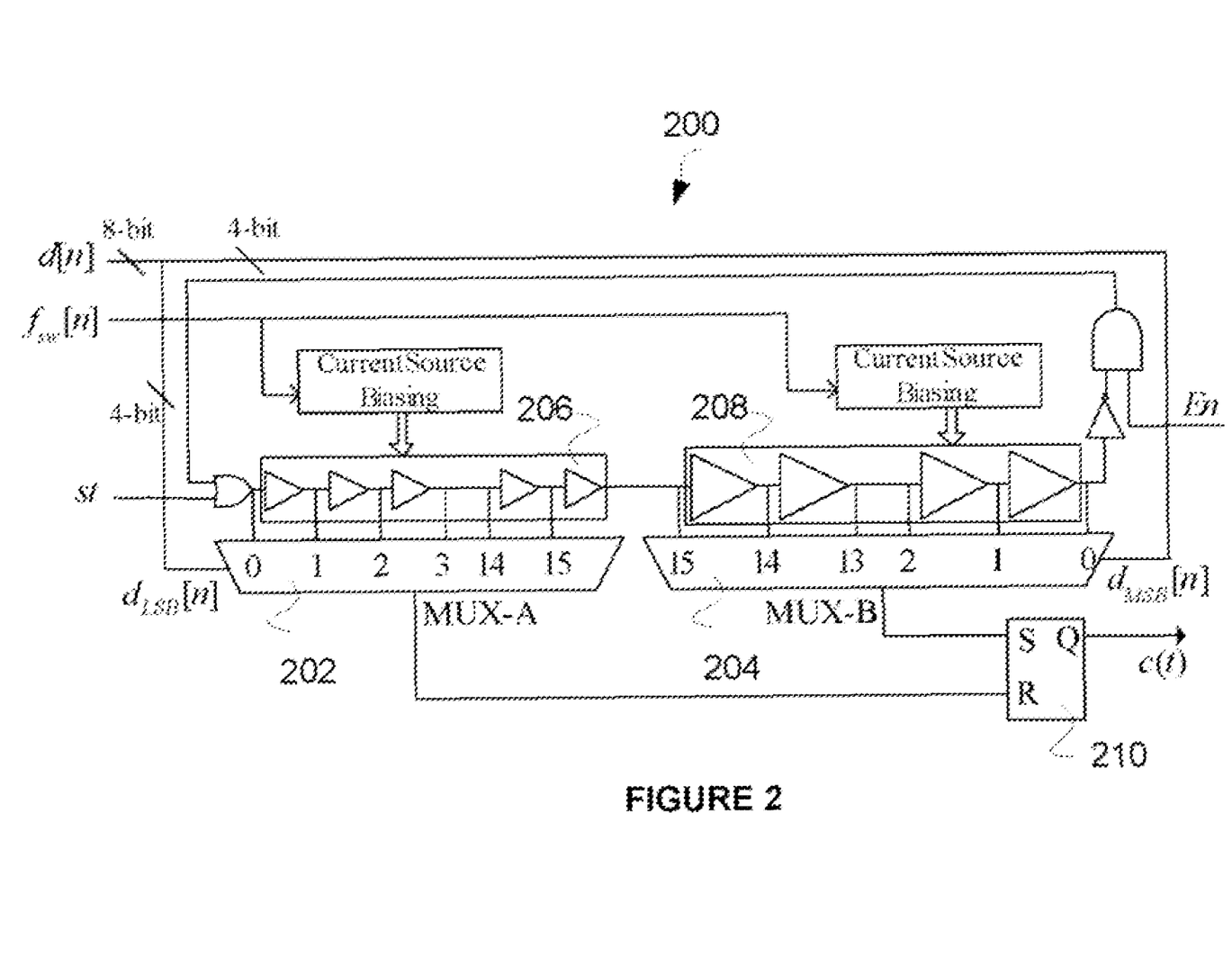
FIG. 2 is a diagram of a DPWM of one embodiment.

One embodiment of the present invention is a DPWM 200, such as that shown in FIG. 2, including a first delay line 206 comprising first delay cells; and a second delay line 208 comprising second delay cells. The second delay cells can be slower than the first delay cells. The first and second delay lines 206 and 108 can be arranged into a ring oscillator. Outputs of at least some of the first delay cells can be inputs to the first multiplexer 202. Outputs of at least some of the second delay cells can be inputs to the second multiplexer 204. The outputs of the first and second multiplexer 202 and 204 can be used to create the DPWM output.

In one embodiment, the output of the second multiplexer 104 can set DPWM output high. After the ring oscillator signal propagates through the remainder of the second delay line and back into the first delay line, the output of the first multiplexer can reset the DPWM output.

The first multiplexer 202 can receive the least significant bits of a DPWM digital control signal and the second multiple 204 can receive the most significant bits of the DPWM digital control signal.

The second delay cells can be an integer times slower than the first delay cells. For example, in one embodiment, the second (slow) delay cells can be sixteen, or another power of two, times slower the first (fast) delay cells.

The delay of a slow delay cell can be equal to the delay of the first delay line. A linearization circuit can be used to maintain the delay of the second delay cells with respect to the delay of the first delay cells. The linearization circuit can include a delay line replica to help maintain the correct delay. The propagation of a signal through the delay line replica can be used to update a digital control signal. The digital control signal can be used to adjust the current bias.

The first and second delay cells can be programmable. In one embodiment, the delay cells are programmable by turning on different sized transistors.

The exemplary 8-bit DPWM 200 shown in FIG. 2 is based on combination of a segmented DPWM and ring oscillator based architecture. This design does not require an external clock and can be implemented on less than 1/16 of the area needed for the conventional ring implementation. The size of the DPWM can be reduced by replacing a large 256:1 multiplexer (MUX) with two 16:1 MUXs.

The first delay line 206 and second delay line 208 can function as part of a ring oscillator. First and second multiplexers 202 and 204 can be connected to the first and second delay lines 206 and 208. The first and second multiplexers 202 and 204 have outputs that are connected to an SR latch 210. The first delay line can include 16 identical fast delay cells. The second line can comprise 16 slow cells. Each of the slow delay cells can be 16 times slower than the delay cells of the first line. The intermediate nodes (taps) of the first line can be passed onto the first multiplexer, and the taps of the second slower delay line can be connected to the second multiplexer.

The 8-bit input d[n] can be divided into two parts. The 4 most significant bits (MSBs) can be inputs for the second multiplexer. They define the rising edge of the pulse-width modulated signal c(t) and coarsely adjust its duty ratio value. The four least significant bits (LSBs) of d[n], inputs of the first multiplexer, define the falling edge of c(t) and perform fine adjustment of the duty ratio.

The operation of the segmented-ring DPWM 200 can be described by observing its behavior for a high and low input control duty ratio values. Let us assume that there is a pulse propagating through the ring oscillator and first consider the case when d[n] is the exemplary binary number 1110 1000, corresponding to a duty ratio of 0.9065. As the pulse is passing through the ring oscillator, the output of the SR latch 210 will be set to high when it reaches the tap 14 of the second multiplexer 104 corresponding to 4MSBs of the binary input d[n]. The pulse now travels through 14 slow cells, then passes through 8 fast delay cells before it reaches tap 8 of the first multiplexer 202 (value corresponding to 4LSBs of d[n]) and resets the SR latch 210. As a result c(t) is set to low. The new switching cycles start as soon as the pulse reaches tap 14 of the second multiplexer 204. When the input is small, for example d[n]=0001, the pulse sets the SR latch at the tap 1 of MUX-B, traverses through only one slow and one fast delay cell and, then, resets the output at the tap 1 of the first multiplexer. This results in low value of duty ratio.

Figure 3:
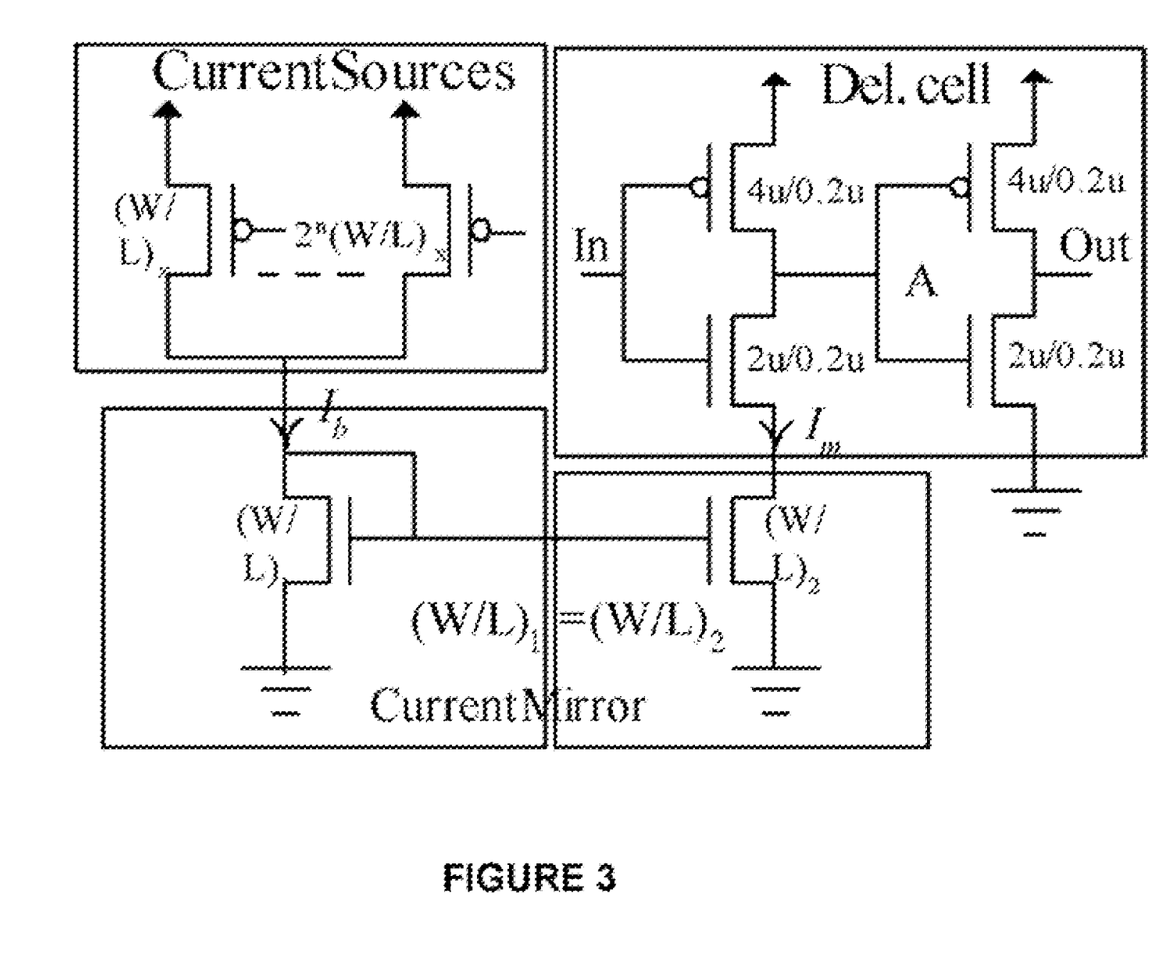
FIG. 3 is a diagram of a digitally programmable-current starved delay cell of one embodiment.

FIG. 3 shows an exemplary digitally programmable current starved delay cell and corresponding current biasing circuit.

The delay of this cell depends on the equivalent capacitance seen at the node A and on the current mirrored by the programmable biasing circuit. The current can be programmed in the binary fashion by changing the number of differently sized (W/L, W/L, 2W/L, 4W/L, and 8W/L) transistors conducting at the same time.

The DPWM structures with non-uniform delay cells can suffer from nonlinearity problems. The mismatch between fast and slow delay cells in some cases can cause the characteristic of the DPWM to become non-monotonic. As a result, local positive feedback and instability of the system can occur.

In order to maintain the linearity of this ring-based segmented DPWM, a linearization block can be employed. The block shown in FIG. 4 can ensure that the delays of the fast and slow cells are such that the slow cells are exactly 16 times slower than the fast cells.

Figure 4:
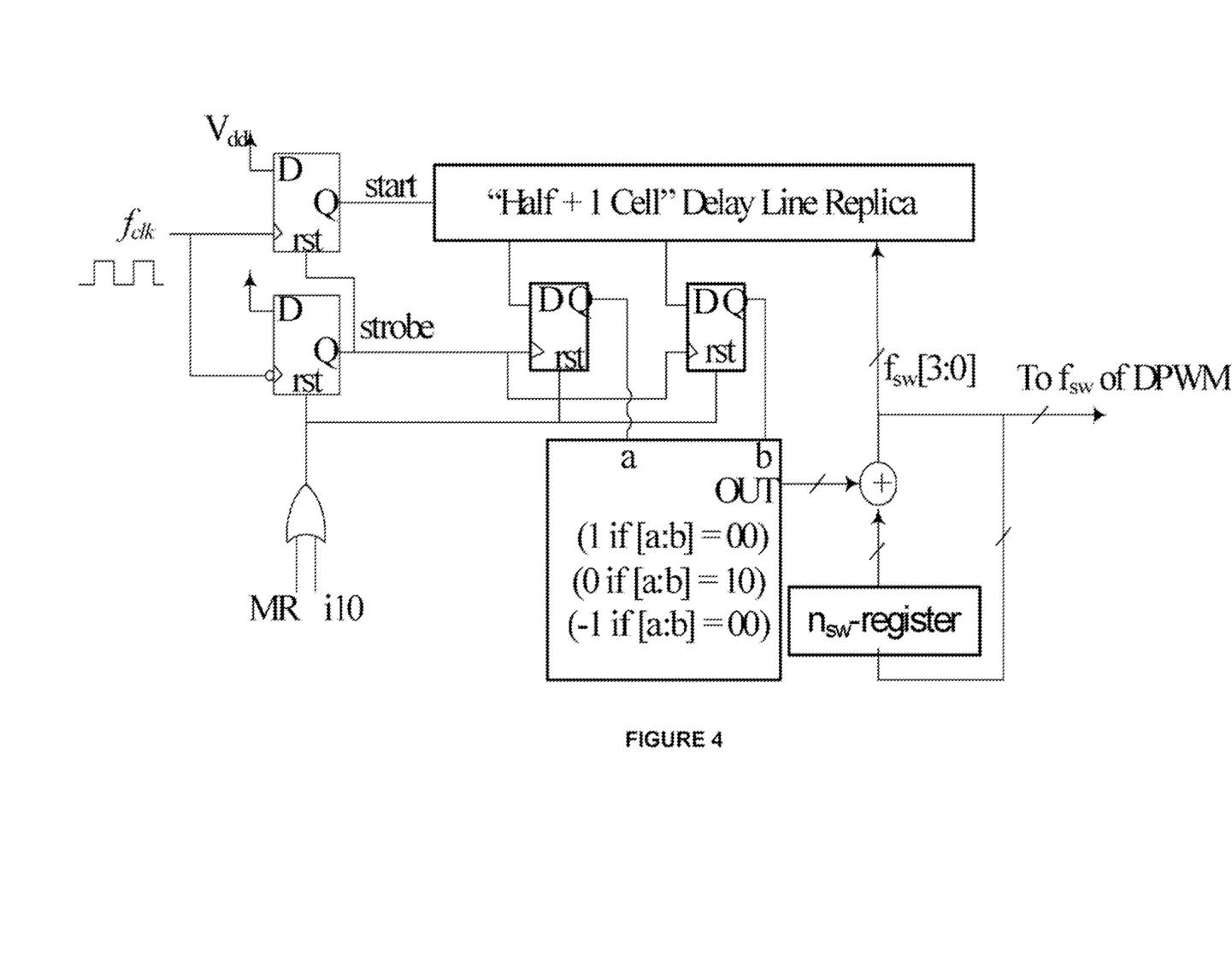
FIG. 4 is a diagram of a frequency regulator block of one embodiment.

The linearization block can consist of a replica of delay line comprising of 16 fast delay cells. This delay can be matched to the signal $f_{clk}$, which is generated by taps from the slow delay line. The period of this signal can correspond to the delay of two slow-delay cells. The rising edges of $f_{clk}$ start propagating a pulse in the delay line replica. The negative edges can latch the intermediate nodes of each of the delay lines. If the delays were perfectly matched, the propagating pulse would just reach the 15th cell, and the output of the extra cell would still be zero. Hence the output of the replica block would latch a '10' state on the negative clock edge of $f_{clk}$. However, if the delays were too slow, it would latch a '00' state indicating that the pulse has not propagated far enough. This will instruct the register to increase the delay by adding another delay element. If the delays were too fast, it would latch an '11' state indicating that the pulse has propagated too far, thereby instructing the register to decrease the delay by removing a delay element. In this way, the matching of the cells is ensured.

This same structure can be used to synchronize the system with an external clock, which in some cases is required to minimize electromagnetic interference. Then an additional frequency regulation block and a replica of delay line comprising 16 slow delay cells can be used to synchronize the frequency of the oscillator with the clock frequency.

In some cases, when the implementation of the DPWM on an application specific IC is not possible and/or a digital control solution implemented in FPGA is required, the presented architecture can be easily modified to fit the new implementation technology. Then, the custom made digitally programmable current starved delay cell of FIG. 3 can be replaced with the all-digital programmable delay cell shown in FIG. 5.

Figure 5:
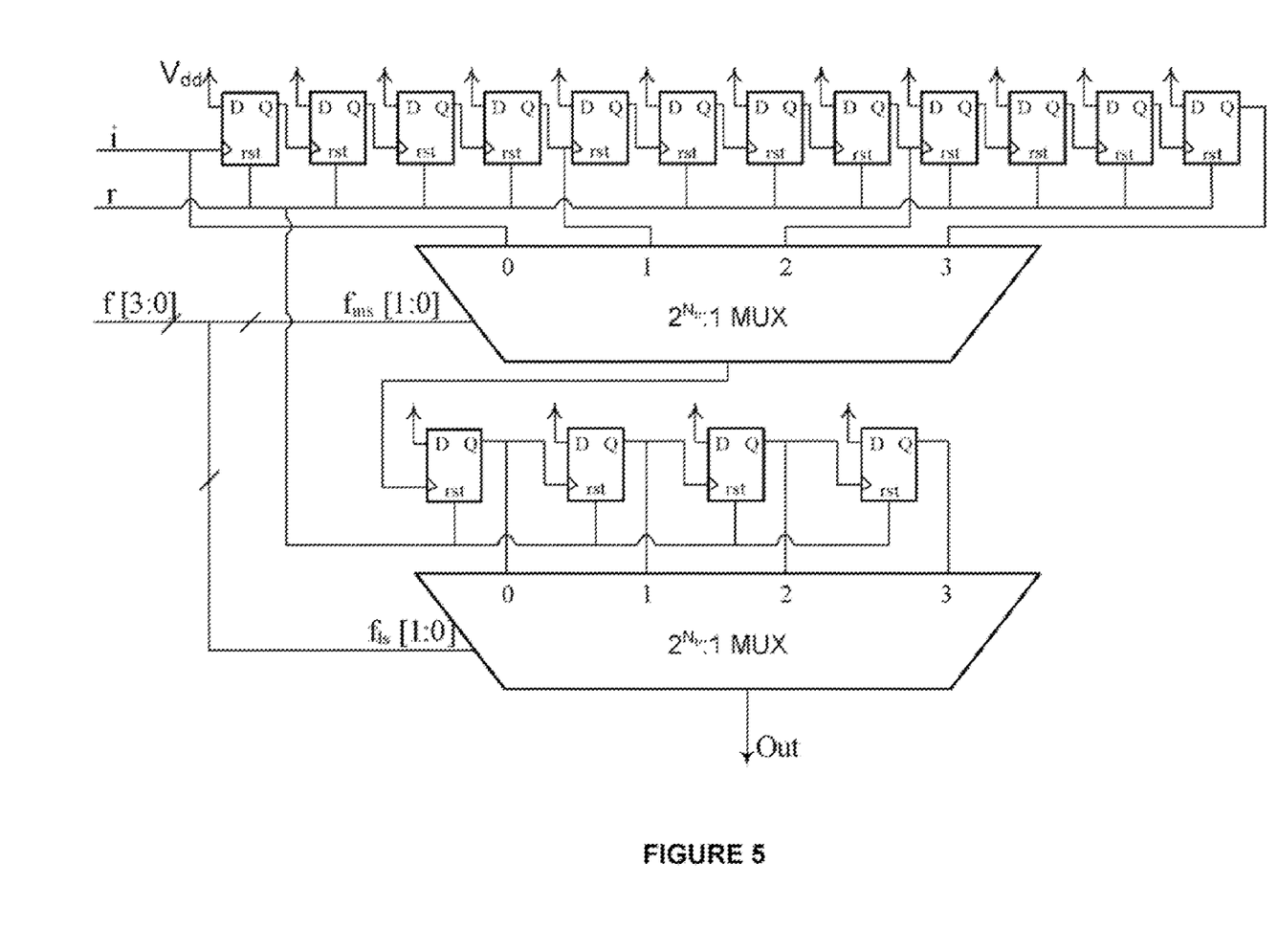
FIG. 5 is a diagram of an all digital delay cell of one embodiment.

The propagation time through the cells can depend on the number of D-flip-flops input signal i passes through before it reaches the output of the cell, Out. The propagation can be regulated with the external signal f[n], which is equivalent to the signal $f_{sw}[n]$, used in the current starved delay cell. In this case the two most significant bits of f[n], $f_{ms}[n]$ are used to define through how many blocks consisting of 4 D-flip-flops the signal goes through, and the 2 least significant bits $f_{ls}[n]$ regulate propagation though blocks having one D-flip-flop only.

Figure 6:
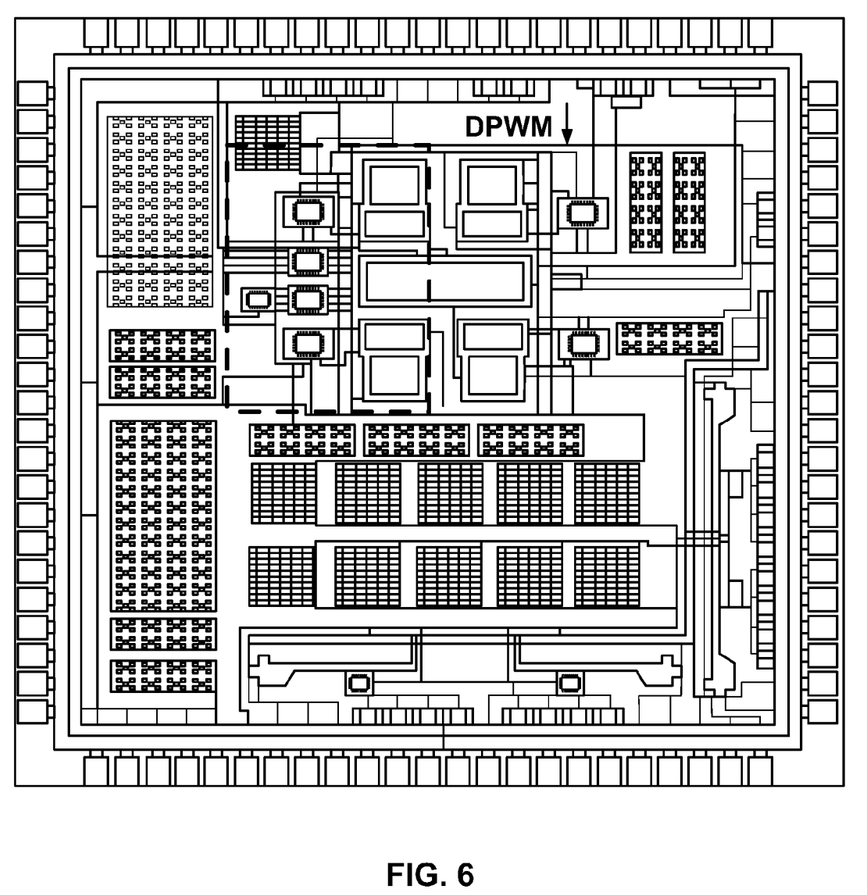
FIG. 6 is a diagram that shows a portion of a digital controller layout belonging to the DPWM of FIG. 2.

The DPWM of FIG. 2 is implemented on a chip, as a part of a controller, in a standard CMOS 0.18 μm process. The chip parameters, listed in Table I, are obtained through HSPICE simulations and its layout is shown in FIG. 6. These results verify very low power consumption of only 4.5 μA/MHz and show that the newly invented architecture needs less than 0.1 mm² for implementation.

Figure 7:
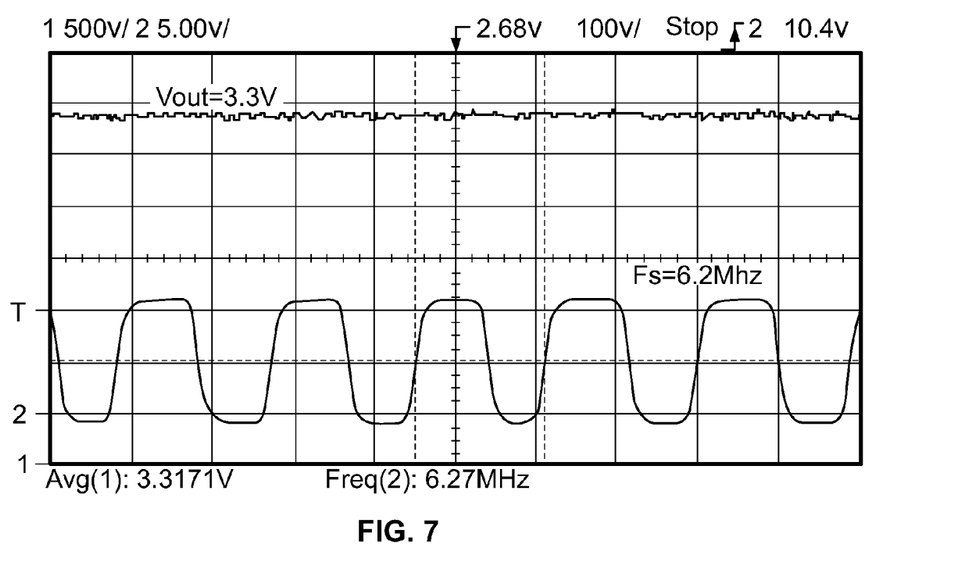
FIG. 7 is a diagram that shows the operation of an exemplary DPWM.

In addition, the DPWM and the controller shown in FIG. 1 utilizing the new architecture is implemented using an FPGA system and tested with an experimental 3 W, 3.3 V buck switching converter. The experimental waveforms of FIG. 7 show operation at the switching frequency of 6.2 MHz, confirming that this invention can operate at switching frequencies comparable to those of the state of the art analog solution.

TABLE I

PARAMETERS OF ON-CHIP IMPLEMENTED DPWM AND DPFM

| | Area | Frequency range | Current cons. |
| --- | --- | --- | --- |
| DPWM | 0.008361 mm² | 1 MHz to 20 MHz | 4.5 μA/MHz |

Embodiments of the present invention introduces a new architecture for digital pulse-width modulator (DPWM) that meets requirements of very high frequency of operation, low power consumption, implementation on a small silicon area, and stand-alone operation. All of which are highly desirable in low-power switch-mode power supplies used in modern portable devices. To achieve these characteristics the DPWM can utilize a non-symmetric oscillator, digitally programmable current-starved delay cells and variable positioning of the rising and falling edge of the pulse-width modulated signal. In addition, the linearity of the characteristic can be ensured with a frequency regulation block.

The foregoing description of preferred embodiments of the present invention has been provided for the purposes of illustration and description. It is not intended to be exhaustive or to limit the invention to the precise forms disclosed. Many embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the claims and their equivalents.

What is claimed is:

1. A DPWM comprising
   a first delay line comprising first delay cells;
   a second delay line comprising second delay cells, the second delay cells being slower than the first delay cells, the first and second delay lines being arranged into a ring oscillator;
   a first multiplexer with inputs that are the outputs of at least some of the first delay cells;
   a second multiplexer with inputs that are the outputs of at least some of the second delay cells, wherein outputs of the first and second multiplexer are used to create the DPWM output.

2. The DPWM of claim 1, wherein the second delay cells are an integer times slower than the first delay cells.

3. The DPWM of claim 2, wherein the integer is a power of 2.

4. The DPWM of claim 2, wherein the integer is equal to the number of first delay cells.

5. The DPWM of claim 4, wherein a linearization circuit is used to maintain the delay of the second delay cells at the integer delay greater than the first delay cells.

6. The DPWM of claim 1, wherein the first and second delay cells are programmable.

7. The DPWM of claim 6, wherein the delay cells are programmable by turning on different sized transistors.

8. The DPWM of claim 1, further comprising a linearization circuit used to maintain the delay of the second delay cells.

9. The DPWM of claim 8, wherein the linearization circuit includes a delay line replica.

10. The DPWM of claim 9, wherein the propagation of a signal through the delay line replica is used to update a digital control signal.

11. The DPWM of claim 10, wherein the digital control signal is used to adjust current biasing of the second delay cells.

12. The DPWM of claim 1, wherein the output of the first multiplexer resets the DPWM output.

13. The DPWM of claim 1, wherein the output of the second multiplexer sets the DPWM output.

14. The DPWM of claim 1, wherein the output of the second multiplexer sets DPWM output high and wherein after the ring oscillator signal propagates through the remainder of the second delay line and back into the first delay line, the output of the first multiplexer resets the DPWM output.

15. The DPWM of claim 1, wherein in the first multiplexer receives least significant bits of a DPWM digital control signal and the second multiplexer receives most significant bits of the DPWM digital control signal.

* * * * *